(12) United States Patent
Yin et al.

(10) Patent No.: US 8,669,155 B2
(45) Date of Patent: Mar. 11, 2014

(54) HYBRID CHANNEL SEMICONDUCTOR DEVICE AND METHOD FOR FORMING THE SAME

(75) Inventors: Haizhou Yin, Poughkeepsie, NY (US);
Huilong Zhu, Poughkeepsie, NY (US);
Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/142,790

(22) PCT Filed: Apr. 11, 2011

(86) PCT No.: PCT/CN2011/072585
§ 371 (c)(1),
(2), (4) Date: Jun. 29, 2011

(87) PCT Pub. No.: WO2012/027988
PCT Pub. Date: Mar. 8, 2012

(65) Prior Publication Data
US 2012/0056267 A1   Mar. 8, 2012

(30) Foreign Application Priority Data

Sep. 3, 2010 (CN) .......................... 2010 1 0273120

(51) Int. Cl.
*H01L 27/092* (2006.01)

(52) U.S. Cl.
USPC ........... 438/229; 438/128; 438/535; 438/659; 438/685

(58) Field of Classification Search
USPC .......... 257/407, 412, 280, 281; 438/128, 535, 438/659, 685
See application file for complete search history.

(56) References Cited

U.S. PATENT DOCUMENTS 6,376,888 B1 * 4/2002 Tsunashima et al. ......... 257/407
6,475,908 B1 * 11/2002 Lin et al. ...................... 438/659

(Continued)

FOREIGN PATENT DOCUMENTS

CN    1819201 A    8/2006

OTHER PUBLICATIONS

International Search Report for PCT/CN2011/072585 (in Chinese), mailed Jun. 23, 2011; ISA/CN.

(Continued)

*Primary Examiner* — Julio J Maldonado
*Assistant Examiner* — Jaehwan Oh
(74) *Attorney, Agent, or Firm* — Harness, Dickey & Pierce, P.L.C.

(57) ABSTRACT

A hybrid channel semiconductor device and a method for forming the same are provided. The method includes: providing a first semiconductor layer, the first semiconductor layer including an NMOS area and a PMOS area, a surface of the first semiconductor layer being covered by a second semiconductor layer, wherein electrons have higher mobility than holes in one of the first semiconductor layer and the second semiconductor layer, and holes have higher mobility than electrons in the other; forming a first dummy gate structure, and a first source region and a first drain region on respective sides of the first dummy gate structure on the second semiconductor layer in the NMOS area, forming a second dummy gate structure, and a second source region and a second drain region on respective sides of the second dummy gate structure on the second semiconductor layer in the PMOS area; forming an interlayer dielectric layer on the second semiconductor layer and performing planarization; removing the first dummy gate structure and the second dummy gate structure to form a first opening and a second opening; and forming a first gate structure on the one of the first semiconductor layer and the second semiconductor layer in which electrons have higher mobility in the first opening, and forming a second gate structure on the other semiconductor layer in the second opening. The invention can reduce defects in the channel region.

8 Claims, 9 Drawing Sheets

(56) References Cited

U.S. PATENT DOCUMENTS

| | | | |
|---|---|---|---|
| 6,992,357 B2* | 1/2006 | Matsuo et al. | 257/407 |
| 7,208,815 B2* | 4/2007 | Chen et al. | 257/627 |
| 7,393,733 B2* | 7/2008 | Currie | 438/164 |
| 7,602,013 B2* | 10/2009 | Miyano et al. | 257/328 |
| 7,651,901 B2* | 1/2010 | Nakajima | 438/199 |
| 7,846,802 B2* | 12/2010 | Currie et al. | 438/300 |
| 7,884,353 B2* | 2/2011 | Currie et al. | 257/19 |
| 8,080,459 B2* | 12/2011 | Xu | 438/270 |
| 8,237,234 B2* | 8/2012 | Murthy et al. | 257/413 |
| 8,237,247 B2* | 8/2012 | Kim et al. | 257/627 |
| 8,264,042 B2* | 9/2012 | Xiao et al. | 257/350 |
| 2004/0084734 A1* | 5/2004 | Matsuo | 257/407 |
| 2006/0049460 A1* | 3/2006 | Chen et al. | 257/347 |
| 2006/0292770 A1* | 12/2006 | Wu et al. | 438/187 |
| 2007/0001173 A1* | 1/2007 | Brask et al. | 257/67 |
| 2007/0215984 A1 | 9/2007 | Doyle et al. | |
| 2007/0238255 A1* | 10/2007 | Miyano et al. | 438/301 |
| 2008/0064160 A1* | 3/2008 | Kim et al. | 438/233 |
| 2009/0072312 A1* | 3/2009 | Chang et al. | 257/351 |
| 2009/0108301 A1* | 4/2009 | Yin et al. | 257/255 |
| 2009/0159932 A1* | 6/2009 | Pinto et al. | 257/255 |
| 2009/0159933 A1* | 6/2009 | Pinto et al. | 257/255 |
| 2009/0321794 A1* | 12/2009 | Kim et al. | 257/255 |
| 2010/0032727 A1* | 2/2010 | Bu et al. | 257/255 |
| 2010/0052071 A1* | 3/2010 | Niimi et al. | 257/369 |
| 2011/0309351 A1* | 12/2011 | Kumaki et al. | 257/40 |
| 2012/0025181 A1* | 2/2012 | Sasaki | 257/40 |
| 2012/0181518 A1* | 7/2012 | Ogiwara et al. | 257/40 |
| 2012/0220102 A1* | 8/2012 | Or-Bach et al. | 438/458 |

OTHER PUBLICATIONS

Yin, et al., "Direct Silicon Bonded (DSB) Substrate Solid Phase Epitaxy (SPE) Integration Scheme Study for High Performance Bulk CMOS," Electron Devices Meeting, 2006. IEDM '06. International.

\* cited by examiner providing a first semiconductor layer, the first semiconductor layer including an NMOS area and a PMOS area, a surface of the first semiconductor layer being covered by a second semiconductor layer, wherein electrons have higher mobility than holes in one of the first semiconductor layer and the second semiconductor layer, and holes have higher mobility than electrons in the other one of the first semiconductor layer and the second semiconductor layer — S21 forming a first dummy gate structure on the second semiconductor layer in the NMOS area, forming a second dummy gate structure on the second semiconductor layer in the PMOS area, forming a first source region and a first drain region in the second semiconductor layer and the first semiconductor layer and on respective sides of the first dummy gate structure, forming a second source region and a second drain region in the second semiconductor layer and the first semiconductor layer on respective sides of the second dummy gate structure, the first source region and the first drain region being N-type doped, and the second source region and the second drain region being P-type doped — S22 forming an interlayer dielectric layer on the second semiconductor layer and performing planarization on the interlayer dielectric layer, such that the interlayer dielectric layer covers the second semiconductor layer and has a surface aligned with those of the first dummy gate structure and the second dummy gate structure — S23 removing the first dummy gate structure to form a first opening, removing the second dummy gate structure to form a second opening — S24 forming a first gate structure in the first opening and a second gate structure in the second opening such that the first opening is filled up with the first gate structure and the second opening is filled up with the second gate structure, wherein the first gate structure is formed on the one of the first semiconductor layer and the second semiconductor layer in which electrons have higher mobility than holes, and the second gate structure is formed on the other one of the first semiconductor layer and the second semiconductor layer in which holes have higher mobility than electrons — S25

FIG. 5

HYBRID CHANNEL SEMICONDUCTOR DEVICE AND METHOD FOR FORMING THE SAME

CROSS-REFERENCE TO RELATED APPLICATIONS

This application is a Section 371 U.S. National Stage Application of, and claims priority to, International Application No. PCT/CN2011/072585, filed on Apr. 11, 2011, which claimed priority to Chinese Application No. 201010273120.0, filed on Sep. 3, 2010. The International Application and the Chinese Application are incorporated herein by reference in their entireties.

This application claims priority to Chinese patent application No. 201010273120.0 titled "HYBRID CHANNEL SEMICONDUCTOR DEVICE AND METHOD FOR FORMING THE SAME" and filed with the State Intellectual Property Office on Sep. 3, 2010, the content of which is incorporated herein by reference in its entirety.

FIELD OF THE INVENTION

The present invention relates to semiconductor devices and semiconductor fabrication, and in particular, to a hybrid channel semiconductor device and a method for forming the same.

BACKGROUND OF THE INVENTION

It is discovered that in semiconductor devices (for example, those formed on a silicon substrate), electrons have high mobility in a silicon substrate the crystal face orientation of which is (100), and holes have high mobility in a silicon substrate the crystal face orientation of which is (110). At the same time, CMOS techniques, the leading technology for very-large-scale integration, involve forming PMOS transistors and NMOS transistors on the same substrate. Therefore, in order to improve device performances and reduce circuit response time, it is desirable to integrate a (100) silicon surface and a (110) silicon surface in a single substrate, and form NMOS transistors on the (100) silicon substrate and form PMOS transistors on the (110) silicon substrate, i.e., to form a hybrid channel semiconductor device.

FIGS. 1-4 illustrate a conventional method for forming a hybrid channel semiconductor device.

As shown in FIG. 1, a first semiconductor layer 10 is provided, and the first semiconductor layer 10 is (100) monocrystalline silicon. A second semiconductor layer 11 is formed on the first semiconductor layer 10 by Direct Silicon Bonding (DSB), and the second semiconductor layer 11 is (110) monocrystalline silicon. The first semiconductor layer 10 consists of area I, area II and area III. P-wells (not shown) are formed in area I and area III, N-wells (not shown) are formed in area II, and Shallow Trench Isolation (STI) 12 structures are formed at the interface between the areas.

As shown in FIG. 2, a mask pattern 13 is formed on the second semiconductor layer 11 in area II. The mask pattern 13 may be a photoresist pattern or a hardmask pattern. By using the mask pattern 13 as a mask, ion implantation is performed on the second semiconductor layer 11, such that the second semiconductor layer 11 in area I and area III is amorphized to form an amorphous silicon layer 11a.

As shown in FIG. 3, by Solid Phase Epitaxy (SPE), the amorphous silicon layer in area I and area III is converted to a monocrystalline silicon layer 11b, and the crystal face orientation of the monocrystalline silicon layer 11b is the same as that of the first semiconductor layer 10, i.e., (100). Thus, the crystal face orientation of the monocrystalline silicon layer 11b in area I and area III on the surface of the first semiconductor layer 10 is (100), and the crystal face orientation of the second semiconductor layer 11 is (110).

As shown in FIG. 4, then, by a conventional CMOS process in the prior art, NMOS transistors 14 and 16 are formed in both area I and area III, and a PMOS transistor 15 is formed in area II.

For more information on the method described above, please refer to "Direct Silicon Bonded (DSB) Substrate Solid Phase Epitaxy (SPE) Integration Scheme Study for High Performance Bulk CMOS" by Haizhou Yin et al. published on "Electron Devices Meeting, 2006. IEDM '06. International".

However, in the method above, the amorphization of the second semiconductor layer 11 by ion implantation as shown in FIG. 2 may introduce defects in the amorphous silicon layer 11a in area I and area III; and the defects will remain in the recrystallized monocrystalline silicon layer 11b shown in FIG. 3. If the defects are located in the channel region of the NMOS transistor 14 or 16 shown in FIG. 4, the performances of the NMOS transistor 14 or 16 will be degraded.

SUMMARY OF THE INVENTION

A problem to be solved by the present invention is to provide a hybrid channel semiconductor device and a method for forming the same, to reduce defects in the channel region and improve device performances.

To solve the problem above, the present invention provides a method for forming a hybrid channel semiconductor device, including:

providing a first semiconductor layer, the first semiconductor layer including an NMOS area and a PMOS area, a surface of the first semiconductor layer being covered by a second semiconductor layer, wherein electrons have higher mobility than holes in one of the first semiconductor layer and the second semiconductor layer, and holes have higher mobility than electrons in the other one of the first semiconductor layer and the second semiconductor layer;

forming a first dummy gate structure on the second semiconductor layer in the NMOS area, forming a second dummy gate structure on the second semiconductor layer in the PMOS area, forming a first source region and a first drain region in the second semiconductor layer and the first semiconductor layer and on respective sides of the first dummy gate structure, forming a second source region and a second drain region in the second semiconductor layer and the first semiconductor layer on respective sides of the second dummy gate structure, the first source region and the first drain region being N-type doped, and the second source region and the second drain region being P-type doped;

forming an interlayer dielectric layer on the second semiconductor layer and performing planarization on the interlayer dielectric layer, such that the interlayer dielectric layer covers the second semiconductor layer and has a surface aligned with those of the first dummy gate structure and the second dummy gate structure;

removing the first dummy gate structure to form a first opening, removing the second dummy gate structure to form a second opening; and forming a first gate structure in the first opening and a second gate structure in the second opening such that the first opening is filled up with the first gate structure and the second opening is filled up with the second gate structure, wherein the first gate structure is formed on the one of the first semiconductor layer and the second semiconductor layer in which electrons have higher mobility than holes, and the second gate structure is formed on the other one of the first semiconductor layer and the second semiconductor layer in which holes have higher mobility than electrons.

Optionally, the second semiconductor layer has a thickness ranging from 3 nm to 10 nm.

Optionally, the crystal face orientation of the first semiconductor layer is (100) and the crystal face orientation of the second semiconductor layer is (110).

Optionally, the forming a first gate structure in the first opening and a second gate structure in the second opening includes:

removing a portion of the second semiconductor layer at a bottom of the first opening such that the first semiconductor layer is exposed; and forming the first gate structure in the first opening and the second gate structure in the second opening.

Optionally, before forming the first gate structure and the second gate structure, the method for forming a hybrid channel semiconductor device further includes: forming a third semiconductor layer at the bottom of the first opening, the third semiconductor layer having a surface aligned with that of the second semiconductor layer, and the third semiconductor layer having the same crystal face orientation as the first semiconductor layer.

Optionally, the removing the portion of the second semiconductor layer at a bottom of the first opening includes:

forming a mask layer covering bottoms of the first opening and the second opening;

patterning the mask layer to define a pattern of the first opening;

performing etching to remove the portion of the second semiconductor layer at the bottom of the first opening by using the patterned mask layer as a mask; and removing the patterned mask layer.

Optionally, the crystal face orientation of the first semiconductor layer is (110) and the crystal face orientation of the second semiconductor layer is (100).

Optionally, the forming a first gate structure in the first opening and a second gate structure in the second opening includes:

removing a portion of the second semiconductor layer at a bottom of the second opening such that the first semiconductor layer is exposed; and forming the first gate structure in the first opening and the second gate structure in the second opening.

Optionally, before forming the first gate structure and the second gate structure, the method for forming a hybrid channel semiconductor device further includes: forming a third semiconductor layer at the bottom of the second opening, the third semiconductor layer having a surface aligned with that of the second semiconductor layer, and the third semiconductor layer having the same crystal face orientation as the first semiconductor layer.

Optionally, the removing the portion of the second semiconductor layer at the bottom of the second opening includes:

forming a mask layer covering sidewalls and bottoms of the first opening and the second opening and covering a surface of the interlayer dielectric layer;

patterning the mask layer to define a pattern of the second opening;

performing etching to remove the portion of the second semiconductor layer at the bottom of the second opening by using the patterned mask layer as a mask; and removing the patterned mask layer.

Optionally, the portion of the second semiconductor layer is removed by wet etching.

Optionally, etchant used in the wet etching is a tetramethylammonium hydroxide solution.

Optionally, the first semiconductor layer and the second semiconductor layer are formed of the same material, the material being any one of: monocrystalline silicon, germanium, silicon-germanium and a III-V compound.

Optionally, the first semiconductor layer and the second semiconductor layer are formed of different materials, the material for the first semiconductor layer being one of: monocrystalline silicon, germanium, silicon-germanium and a III-V compound; and the material for the second semiconductor layer being another one of: monocrystalline silicon, germanium, silicon-germanium and a III-V compound.

To solve the problem above, the present invention provides a hybrid channel semiconductor device, including:

a first semiconductor layer and a second semiconductor layer covering the first semiconductor layer, the first semiconductor layer including an NMOS area and a PMOS area, wherein electrons have higher mobility than holes in one of the first semiconductor layer and the second semiconductor layer, and holes have higher mobility than electrons in the other one of the first semiconductor layer and the second semiconductor layer;

a first gate structure, formed in the NMOS area and on the one of the first semiconductor layer and the second semiconductor layer in which electrons have higher mobility than holes;

a second gate structure, formed in the PMOS area and on the other one of the first semiconductor layer and the second semiconductor layer in which holes have higher mobility than electrons;

a first source region and a first drain region, formed in the second semiconductor layer and the first semiconductor layer and on respective sides of the first gate structure in the NMOS area, the first source region and the first drain region being N-type doped; and a second source region and a second drain region, formed in the second semiconductor layer and the first semiconductor layer and on respective sides of the second gate structure in the PMOS area, the second source region and the second drain region being P-type doped.

Optionally, the second semiconductor layer has a thickness ranging from 3 nm to 10 nm.

Optionally, the crystal face orientation of the first semiconductor layer is (100) and the crystal face orientation of the second semiconductor is (110), and the first gate structure is formed on the first semiconductor layer and the second gate structure is formed on the second semiconductor layer.

Optionally, the hybrid channel semiconductor device further includes a third semiconductor layer, formed between the first gate structure and the first semiconductor layer, the third semiconductor layer having a surface aligned with that of the second semiconductor layer and having the same crystal face orientation as the first semiconductor layer.

Optionally, the crystal face orientation of the first semiconductor layer is (110) and the crystal face orientation of the second semiconductor layer is (100), the first gate structure is formed on the second semiconductor layer, and the second gate structure is formed on the first semiconductor layer.

Optionally, the hybrid channel semiconductor device further includes: a third semiconductor layer, formed between the second gate structure and the first semiconductor layer, the third semiconductor layer having a surface aligned with that of the second semiconductor layer and having the same crystal face orientation as the first semiconductor layer.

Optionally, the first semiconductor layer and the second semiconductor layer are formed of the same material, the material being any one of: monocrystalline silicon, germanium, silicon-germanium and a III-V compound.

Optionally, the first semiconductor layer and the second semiconductor layer are formed of different materials, the material for the first semiconductor layer being one of: monocrystalline silicon, germanium, silicon-germanium and a III-V compound; and the material for the second semiconductor layer being another one of: monocrystalline silicon, germanium, silicon-germanium and a III-V compound.

The technical solution according to the present invention has the following advantages over the prior art.

The technical solution uses a first semiconductor layer covered with a second semiconductor layer on its surface. Electrons have higher mobility than holes in one of the first semiconductor layer and the second semiconductor layer, and holes have higher mobility than electrons in the other. Then, a portion of the second semiconductor layer in a certain area is removed such that both the area in which electrons have higher mobility than holes and the area in which holes have higher mobility than electrons are exposed. Then, an NMOS transistor is formed with its channel formed in the area in which electrons have higher mobility than holes, and a PMOS transistor is formed with its channel formed in the area in which holes have higher mobility than electrons. Hence, carrier mobility is high in both the PMOS transistor and the NMOS transistor. Thus, defects in the channel regions can be reduced, and device performances can be improved.

BRIEF DESCRIPTION OF THE DRAWINGS

FIG. 5 is a flow chart of a method for forming a hybrid channel semiconductor device according to an embodiment of the invention.

DETAILED DESCRIPTION OF THE INVENTION

Figure 1:
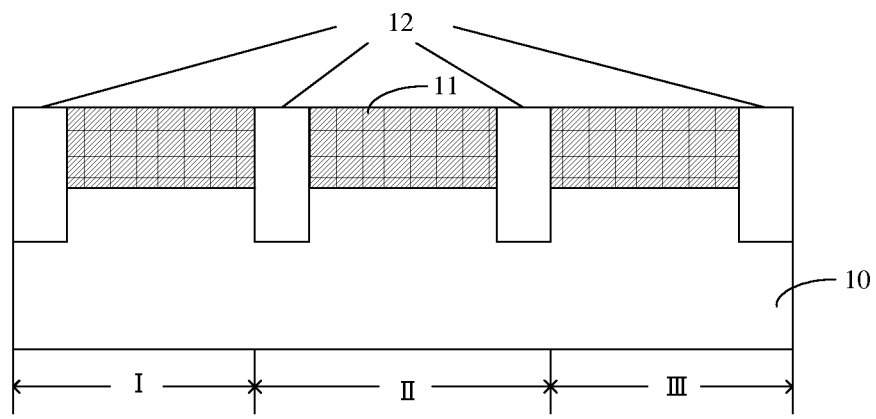
FIGS. 1-4 illustrate a conventional method for forming a hybrid channel semiconductor device with a cross-sectional view of an intermediate structure.
Figure 2:
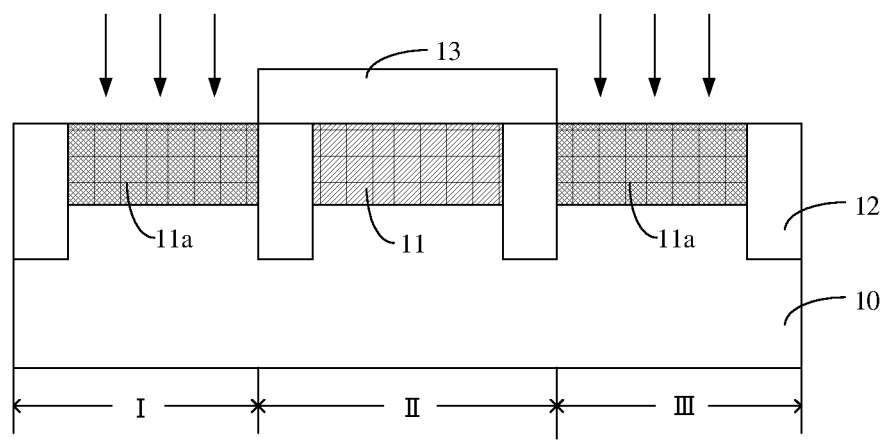
Figure 3:
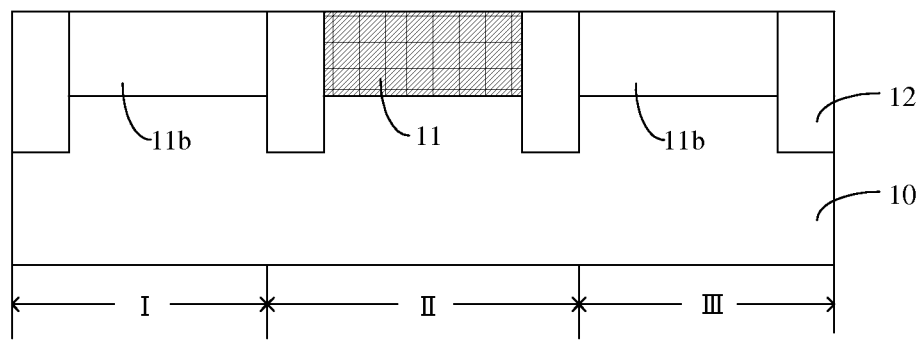
Figure 4:
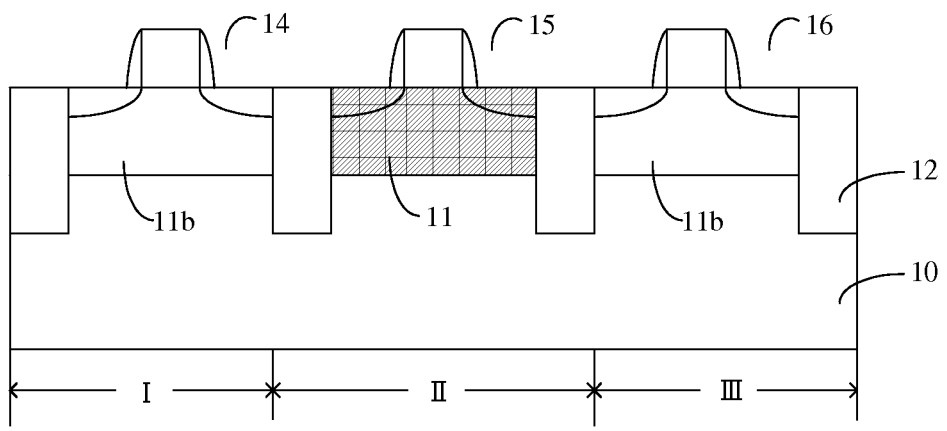

In the conventional method for forming a hybrid channel semiconductor device, the second semiconductor layer is amorphized by ion implantation, and the amorphized area is recrystallized by solid phase epitaxy, enabling change of the crystalline orientation. However, during ion implantation, defects may be introduced in the second semiconductor layer; and the defects may affect the performances of the MOS transistor which is formed subsequently on the second semiconductor layer.

The technical solution uses a first semiconductor layer with a second semiconductor layer covering on its surface, wherein electrons have higher mobility than holes in one of the first semiconductor layer and the second semiconductor layer, and holes have higher mobility than electrons in the other one; then, a portion of the second semiconductor layer in a certain area is removed such that both the area in which electrons have higher mobility than holes and the area in which holes have higher mobility than electrons are exposed; then, an NMOS transistor is formed with its channel formed in the area in which electrons have higher mobility than holes, and a PMOS transistor is formed with its channel formed in the area in which holes have higher mobility than electrons. Hence, carrier mobility is high in both the PMOS transistor and the NMOS transistor, defects in the channel regions can be reduced, and device performance can be improved.

The above objectives, features and advantages of the present invention will become apparent from the following description when taken in conjunction with the accompanying drawings.

For better understanding of the present invention, specific details are described in the following description. It should be noted, the present invention can be implemented in a way that is different from the embodiments disclosed herein; and numerous modifications and alternations can be made by those skilled in the art without deviation from the scope of the invention. Hence, the present invention should not be limited to the embodiments disclosed herein.

FIG. 5 is a flow chart of a method for forming a hybrid channel semiconductor device according to an embodiment of the invention. As shown in FIG. 5, the method includes:

step S21, providing a first semiconductor layer, the first semiconductor layer including an NMOS area and a PMOS area, a surface of the first semiconductor layer being covered by a second semiconductor layer, wherein electrons have higher mobility than holes in one of the first semiconductor layer and the second semiconductor layer, and holes have higher mobility than electrons in the other one of the first semiconductor layer and the second semiconductor layer;

step S22, forming a first dummy gate structure on the second semiconductor layer in the NMOS area, forming a second dummy gate structure on the second semiconductor layer in the PMOS area, forming a first source region and a first drain region in the second semiconductor layer and the first semiconductor layer on the sides of the first dummy gate structure, forming a second source region and a second drain region in the second semiconductor layer and the first semiconductor layer on the sides of the second dummy gate structure, the first source region and the first drain region being N-type doped, and the second source region and the second drain region being P-type doped;

step S23, forming an interlayer dielectric layer on the second semiconductor layer and performing planarization, such that the interlayer dielectric layer covers the second semiconductor layer and has a surface aligned with those of the first dummy gate structure and the second dummy gate structure;

step S24, removing the first dummy gate structure to form a first opening, removing the second dummy gate structure to form a second opening; and step S25, forming a first gate structure in the first opening and a second gate structure in the second opening such that the first opening is filled up with the first gate structure and the second opening is filled up with the second gate structure, and that the first gate structure is formed on the one of the first semiconductor layer and the second semiconductor layer in which electrons have higher mobility than holes, and the second gate structure is formed on the other of the first semiconductor layer and the second semiconductor layer in which holes have higher mobility than electrons.

The method for forming a hybrid channel semiconductor device according to an embodiment of the invention is described below with reference to FIGS. 5-16.

Figure 6:
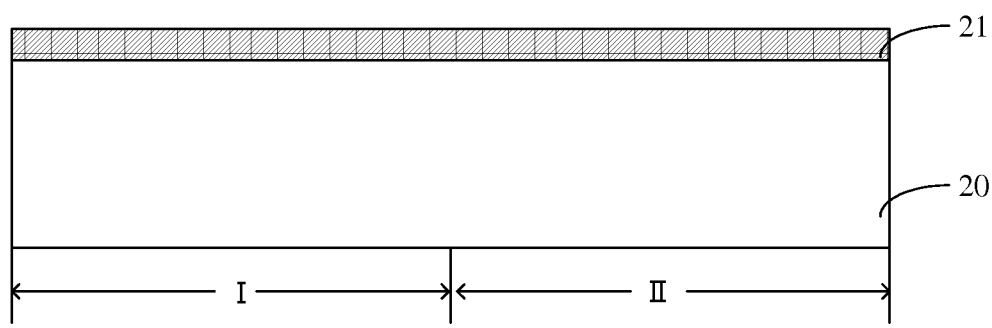
FIGS. 6-16 illustrate a method for forming a hybrid channel semiconductor device according to an embodiment of the invention with a cross-sectional view of an intermediate structure.

With reference to FIG. 5 and FIG. 6, step S21 is performed. A first semiconductor layer is provided; the first semiconductor layer includes an NMOS area and a PMOS area; the surface of the first semiconductor layer is covered by a second semiconductor layer; wherein electrons have higher mobility than holes in one of the first semiconductor layer and the second semiconductor layer, and holes have higher mobility than electrons in the other one of the first semiconductor layer and the second semiconductor layer.

Specifically, a first semiconductor layer 20 is provided; the first semiconductor layer 20 may be formed of a semiconductor material, which may be any one of: monocrystalline silicon, germanium, silicon-germanium and a III-V compound, or can have a Silicon On Insulator (SOI) structure or an epitaxy-on-silicon structure. The first semiconductor layer 20 includes an NMOS area I and a PMOS area II; and the surface of the first semiconductor layer 20 is covered by a second semiconductor layer 21. The second semiconductor layer 21 may be formed on the first semiconductor layer 20 by direct silicon bonding; the thickness of the second semiconductor layer 21 ranges from 3 nm to 10 nm, e.g., 5 nm or 8 nm; and the material for the second semiconductor layer 21 may be the same as the first semiconductor layer 20, or may be different from it, e.g., another one of: monocrystalline silicon, germanium, silicon-germanium and a III-V compound. In this embodiment, the first semiconductor layer 20 may be a monocrystalline silicon wafer, and the second semiconductor layer 21 may be a monocrystalline silicon layer directly bonded to the wafer. In addition, in other embodiments, the first semiconductor layer 20 may be a thin film of any of the materials above formed on a wafer, and the second semiconductor layer 21 may be directly bonded to the first semiconductor layer 20; as an example, the first semiconductor layer 20 may be monocrystalline silicon and the second semiconductor layer 21 may be silicon-germanium, or, the first semiconductor layer 20 may be silicon-germanium and the second semiconductor layer 21 may be silicon-germanium, etc. The use of silicon-germanium can provide higher carrier mobility in the eventual semiconductor device.

Electrons have higher mobility than holes in one of the first semiconductor layer 20 and the second semiconductor layer 21, and holes have higher mobility than electrons in the other one. In this embodiment, the crystal face orientation of the first semiconductor layer 20 is (100) in which electrons have higher mobility than holes; the crystal face orientation of the second semiconductor layer 21 is (110) in which holes have higher mobility than electrons. P-wells (not shown) are formed in the second semiconductor layer 21 and the first semiconductor layer 20 in the NMOS area I; N-wells (not shown) are formed in the second semiconductor layer 21 and the first semiconductor layer 20 in the PMOS area II. In other embodiments, the crystal face orientation of the first semiconductor layer 20 may be (110), and the crystal face orientation of the second semiconductor layer 21 may be (100).

Figure 7:
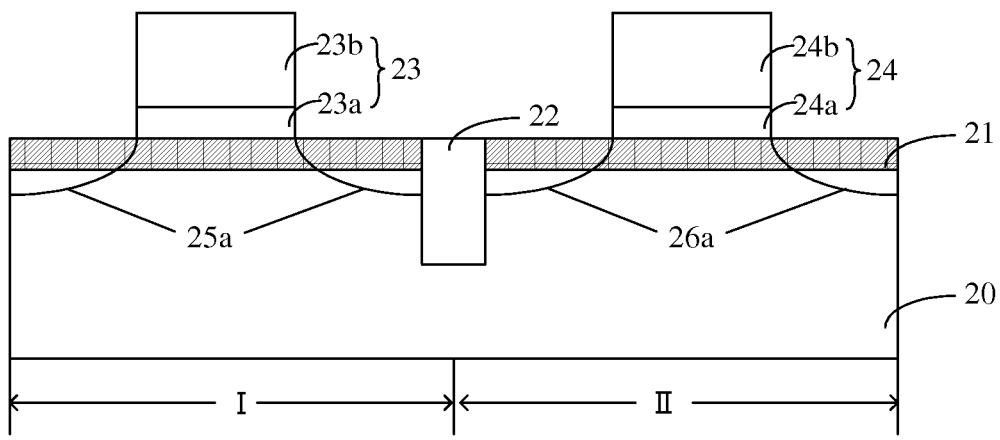
Figure 8:
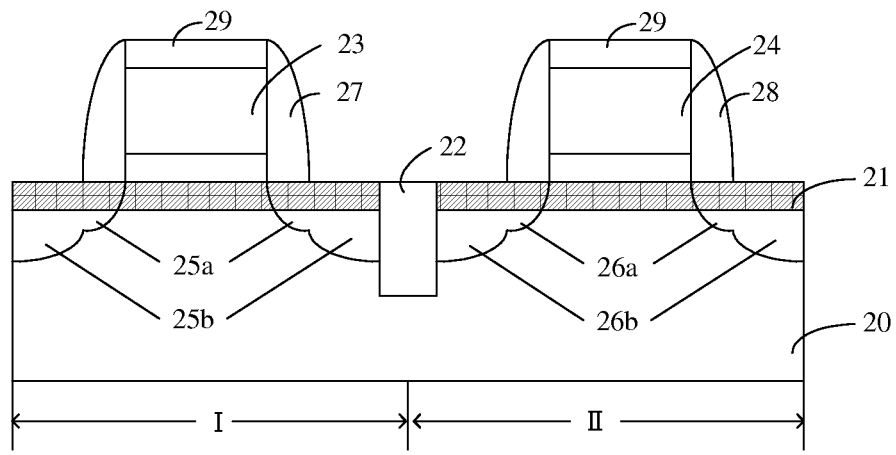

With reference to FIG. 5, FIG. 7 and FIG. 8, step S22 is formed. A first dummy gate structure is formed on the second semiconductor layer in the NMOS area, and a second dummy gate structure is formed on the second semiconductor layer in the PMOS area; a first source region and a first drain region are formed in the second semiconductor layer and the first semiconductor layer on respective sides of the first dummy gate structure, and a second source region and a second drain region are formed in the second semiconductor layer and the first semiconductor layer on respective sides of the second dummy gate structure; the first source region and the first drain region are N-type doped, and the second source region and the second drain region are P-type doped.

As shown in FIG. 7, firstly, a shallow trench isolation area 22 may be formed between the NMOS area I and the PMOS area II. Then, a first dummy gate structure 23 and a second dummy gate structure 24 are formed on the second semiconductor layer 21 in the NMOS area I and in the PMOS area II, respectively. The first dummy gate structure 23 includes a dielectric layer 23a and a dummy gate electrode 23b formed on it, and the second dummy gate structure 24 includes a dielectric layer 24a and a dummy gate electrode 24b formed on it. The dielectric layer 23a and the dielectric layer 24a can be formed of, e.g., silicon dioxide, or silicon nitride. The dielectric layer 23a and the dielectric layer 24a are optional; in other embodiments, the first dummy gate structure 23 may include only the dummy gate electrode 23b, and correspondingly, the second dummy gate structure 24 may include only the dummy gate electrode 24b. Then, the second semiconductor layer 21 and the first semiconductor layer 20 in the NMOS area I are subject to first light-doping ion implantation with N-type ions, e.g., phosphorus ions or arsenic ions; the second semiconductor layer 21 and the first semiconductor layer 20 in the PMOS area II are subject to second light-doping implantation with P-type ions, e.g., boron ions, so that first lightly-doped areas 25a are formed on the sides of the first dummy gate structure 23 and second lightly-doped areas 26a are formed on the sides of the second dummy gate structure 24.

As shown in FIG. 8, a first sidewall 27 may be formed to surround the first dummy gate structure 23, and a second sidewall 28 may be formed to surround the second dummy gate structure 24. This embodiment also includes forming a cap layer 29 on the first dummy gate structure 23 and on the second dummy gate structure 24, respectively. Preferably, in this embodiment, the first sidewall 27, the second sidewall 28 and the cap layer 29 are formed at the same time. Specifically, firstly, a dielectric material layer (not shown) is formed, covering the second semiconductor layer 21, the first dummy gate structure 23 and the second dummy gate structure 24; in this embodiment, the dielectric material layer can be formed of, e.g., silicon nitride, silicon dioxide or silicon oxynitride, by Chemical Vapor Deposition (CVD) or Atom Layer Deposition (ALD). Then, a photoresist pattern (not shown) is formed on the first dummy gate structure 23 and the second dummy gate structure 24; and etching is performed by using the photoresist pattern as a mask to form the first sidewall 27, the second sidewall 28 and the cap layer 29. Finally, the photoresist pattern is removed. As a matter of course, in other embodiments, the cap layer 29 can be formed separately after formation of the first sidewall 27 and the second sidewall 28. After the first sidewall 27 and the second sidewall 28 are formed, the second semiconductor layer 21 and the first semiconductor layer 20 in the NMOS area I are subject to first source/drain implantation, and the second semiconductor layer 21 and the first semiconductor layer 20 in the PMOS area II are subject to second source/drain implantation. The type of ions used in the first source/drain implantation may be the same as the first light-doping ion implantation, i.e., N-type; and the type of ions used in the second source/drain implantation may be the same as the second light-doping implantation, i.e., P-type. Thus, a first source/drain doped area 25b is formed on the sides of the first sidewall 27 and a second source/drain doped area 26b is formed on the sides of the second sidewall 28. The first lightly-doped area 25a and the first source/drain doped area 25b constitute the first source region and the first drain region, and the second lightly-doped area 26a and the second source/drain doped area 26b constitute the second source region and the second drain region. Particularly, the dose of the first source/drain implantation or the second source/drain implantation may be larger than that of the first light-doping ion implantation or the second light-doping implantation, normally, by 2 to 3 orders of magnitude.

It should be noted that the first sidewall 27, the second sidewall 28 and the cap layer 29 are optional. In other embodiments, the first sidewall 27, the second sidewall 28 and the cap layer 29 may not be formed, instead, source/drain ion implantation may be performed directly on the second semiconductor layer 21 and the first semiconductor layer 20 by using the first dummy gate structure 23 and the second dummy gate structure 24 as a mask to form the first source region, the first drain region, the second source region and the second drain region.

With reference to FIGS. 5 and 9-11, step S23 is performed. An interlayer dielectric layer is formed on the second semiconductor layer, and planarization is performed such that the interlayer dielectric layer covers the second semiconductor layer and has a surface aligned with those of the first dummy gate structure and the second dummy gate structure. In this specification, the term "aligned" should be interpreted as: the difference between their heights is within a technically-acceptable range.

Figure 9:
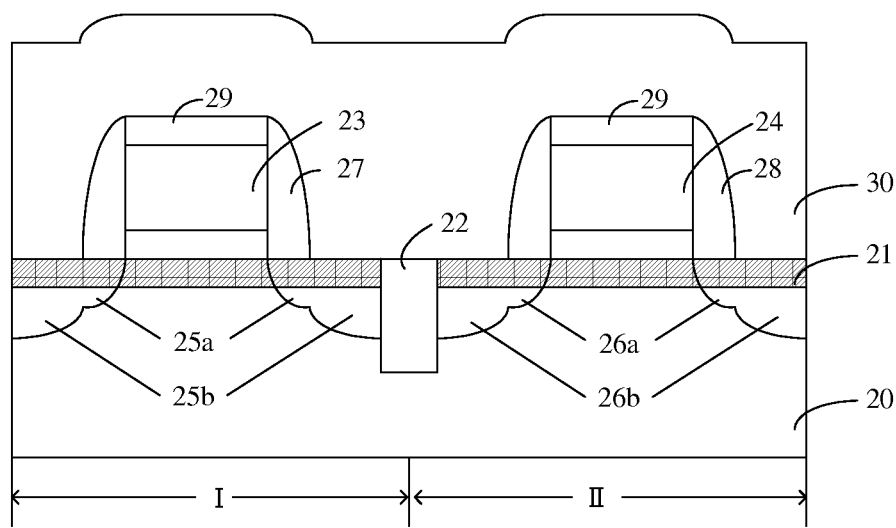

As shown in FIG. 9, an interlayer dielectric layer 30 is formed on the second semiconductor layer 21. The interlayer dielectric layer 30 may be formed of doped or undoped silicon dioxide glass, e.g., borophosphosilicate glass (BPSG), fluorosilicate glass (FSG), phosphosilicate glass (PSG) or a low-k dielectric. In this embodiment, preferably, the interlayer dielectric layer 30 may be formed of doped silicon dioxide glass by chemical vapor deposition and may cover the second semiconductor layer 21, the first sidewall 27, the second sidewall 28 and the cap layer 29.

Figure 10:
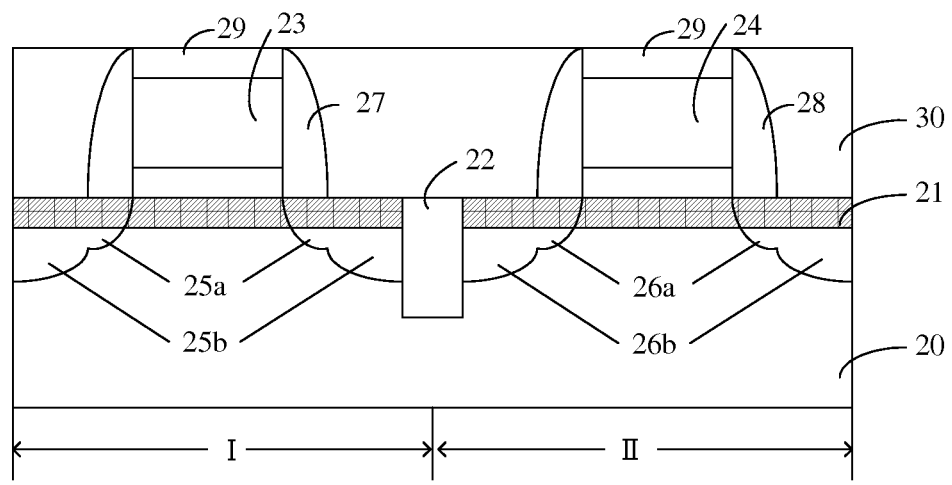

As shown in FIG. 10, the interlayer dielectric layer 30 is planarized by e.g. Chemical Mechanical Polishing (CMP), such that the cap layer 29 is exposed. In this embodiment, endpoint detection may be used to stop CMP at the surface of the cap layer 29.

Figure 11:
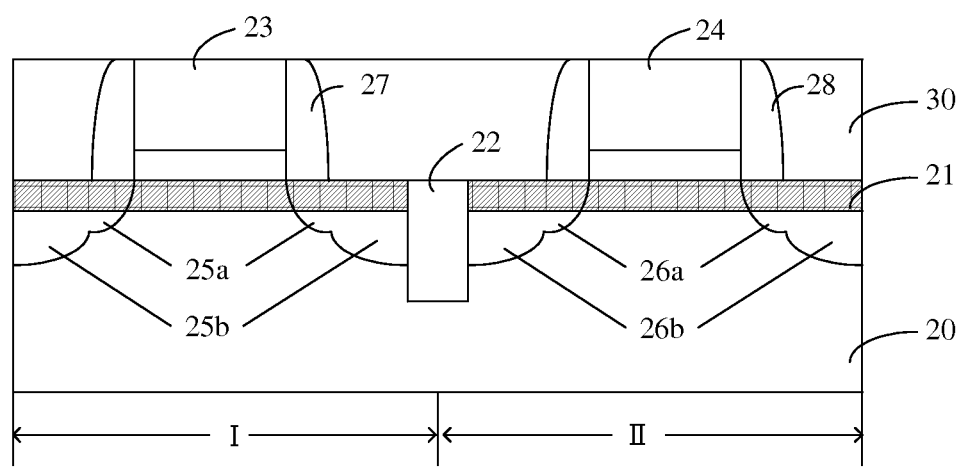

As shown in FIG. 11, the interlayer dielectric layer 30 and the cap layer are planarized by chemical mechanical polishing, such that the tops of the first dummy gate structure 23 and the second dummy gate structure 24 are exposed. The process of polishing may be controlled by endpoint detection or with the depth of polishing, to reduce over-polishing of the first dummy gate structure 23 and the second dummy gate structure 24.

In conjunction with FIG. 10, since the cap layer 29 is on the tops of both the first dummy gate structure 23 and the second dummy gate structure 24, in the process of planarization, the depth of polishing may be controlled by the use of two-step polishing, thereby reducing over-polishing of the first dummy gate structure 23 and the second dummy gate structure 24. It should be noted that, if a cap layer 29 is not formed in the previous step, planarization may be performed directly on the interlayer dielectric layer 30 such that the tops of the first dummy gate structure 23 and the second dummy gate structure 24 are exposed.

Figure 12:
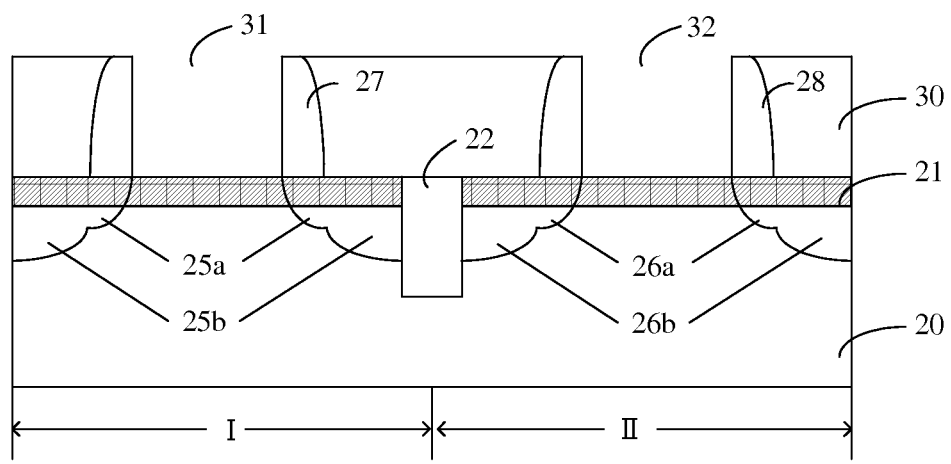

With reference to FIGS. 5 and 12, step S24 is performed. The first dummy gate structure is removed to form a first opening; and the second dummy gate structure is removed to form a second opening. Specifically, as shown in FIG. 12, when the first dummy gate structure and the second dummy gate structure are removed, a first opening 31 and a second opening 32 are formed in their locations, and the second semiconductor layer 21 is exposed at the bottoms of the first opening 31 and the first second opening 32. This process may include removing the dummy gate electrodes in the first dummy gate structure and the second dummy gate structure and then removing the dielectric layer underneath the dummy gate electrodes, or may include removing only the dummy gate electrodes. If the first dummy gate structure and the second dummy gate structure include only the dummy gate electrodes, the removal may be done in only one step.

With reference to FIGS. 5 and 13-16, step S25 is performed. A first gate structure is formed in the first opening and a second gate structure is formed in the second opening, such that the first opening is filled up with the first gate structure and the second opening is filled up with the second gate structure, wherein the first gate structure is formed on the one of the first semiconductor layer and the second semiconductor layer in which electrons have higher mobility than holes, and the second gate structure is formed on the other of the first semiconductor layer and the second semiconductor layer in which holes have higher mobility than electrons.

Figure 13:
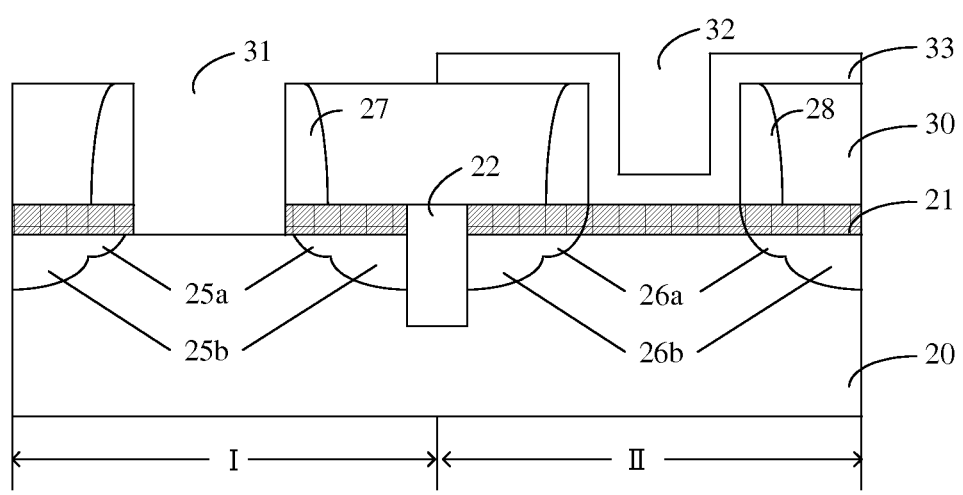

With reference to FIG. 13, a mask layer is formed to cover the sidewalls and the bottoms of the first opening 31 and the second opening 32 and the surface of the interlayer dielectric layer 30. Then, the mask layer is etched with a pattern of the first opening 31, so as to form a patterned mask layer 33. The mask layer may be formed of a dielectric such as silicon dioxide and silicon nitride, or may be a spin-coated photoresist layer. Specifically, in this embodiment, the PMOS area II is covered by the patterned mask layer 33, and the NMOS area I is exposed.

Figure 14:
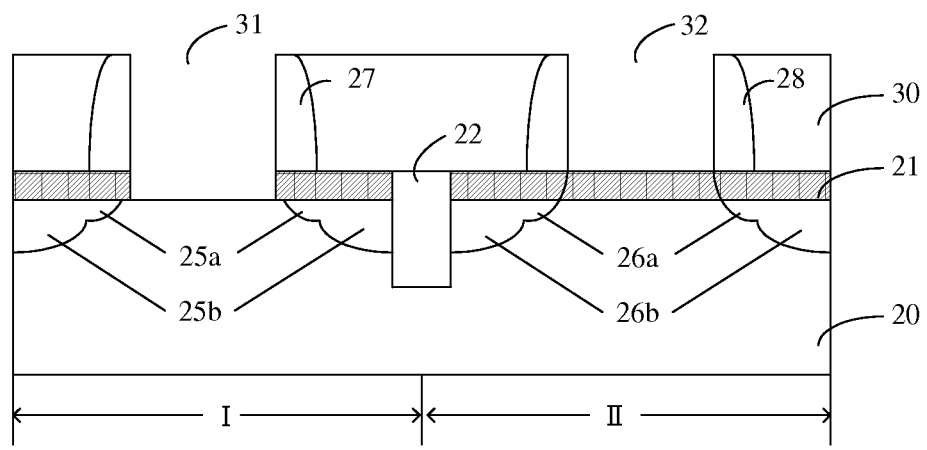

With reference to FIG. 14, by using the patterned mask layer as a mask, etching is performed to remove the second semiconductor layer 21 at the bottom of the first opening 31, so that the first semiconductor layer 20 is exposed. Then, the patterned mask layer is removed. In this embodiment, the second semiconductor layer 21 at the bottom of the first opening 31 is removed by selective wet etching using e.g. a tetramethylammonium hydroxide (TMAH) solution. Selective wet etching can result in less damage to the second semiconductor layer 21 at the bottom of the opening 31. Furthermore, in other embodiments, dry etching, e.g., Reactive-Ion Etching (RIE), may be used. Dry etching can result in less damage to the second semiconductor layer 21 than the amorphizing by ion implantation in the conventional method described in the Background of the Invention; and wet etching can even result in less damage than dry etching. Since the second semiconductor layer 21 at the bottom of the opening 31 will be used as the channel region of the NMOS transistor in subsequent processes, less damage and defects can effectively improve the performance of the device.

Figure 15:
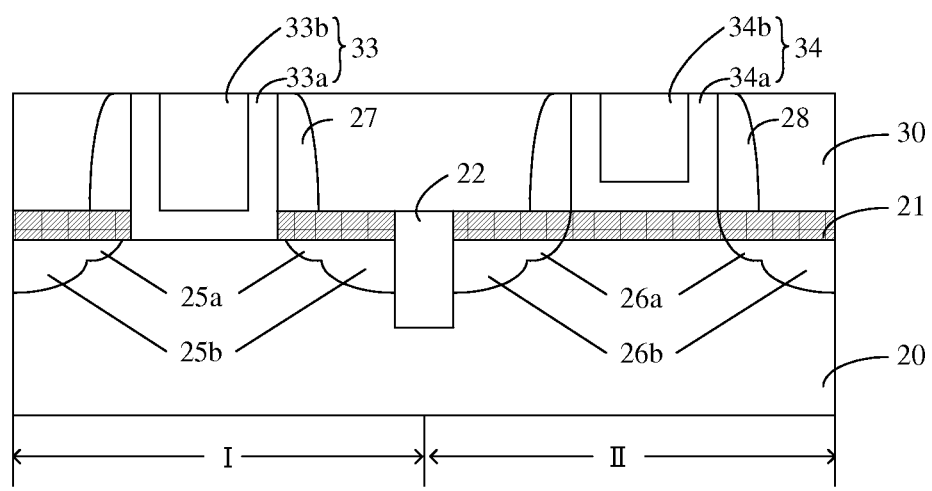

With reference to FIG. 15, firstly, a gate dielectric material layer (not shown; in fact, forming the gate dielectric material layer can be omitted in those embodiments where only the dummy gate electrodes are removed and the gate dielectric layer is not removed) is formed, covering the sidewalls and the bottoms of both the first opening and the second opening, and covering the interlayer dielectric layer 30. The gate dielectric material layer may be formed of a high-K dielectric, e.g., any one or a combination of: $HfO_2$, HFSiO, HfON, $La_2O_3$, LaAlO, $Al_2O_3$, $ZrO_2$, ZrSiO, $TiO_2$ and $Y_2O_3$, by chemical vapor deposition or atom layer deposition. Then, a gate electrode material layer (not shown) is formed, covering the gate dielectric material layer and filling up the first opening and the second opening. The gate electrode material layer can be formed of metal, e.g., tungsten (W), aluminium (Al), titanium (Ti), cobalt (Co) or nickel (Ni). Before the formation of the gate electrodes, a work function metal layer may be formed on the gate dielectric layer. The work function metal layer may be formed of any one or a combination of: TiN, TiAlN, TaN, TaAlN and TaC. Then, the gate electrode material layer and the gate dielectric material layer are planarized such that the surface of the interlayer dielectric layer 30 is exposed, so as to form a first gate structure 33 and a second gate structure 34. The first gate structure 33 includes a gate dielectric layer 33a and a gate electrode 33b; and the second gate structure 34 includes a gate dielectric layer 34a and a gate electrode 34b.

Figure 16:
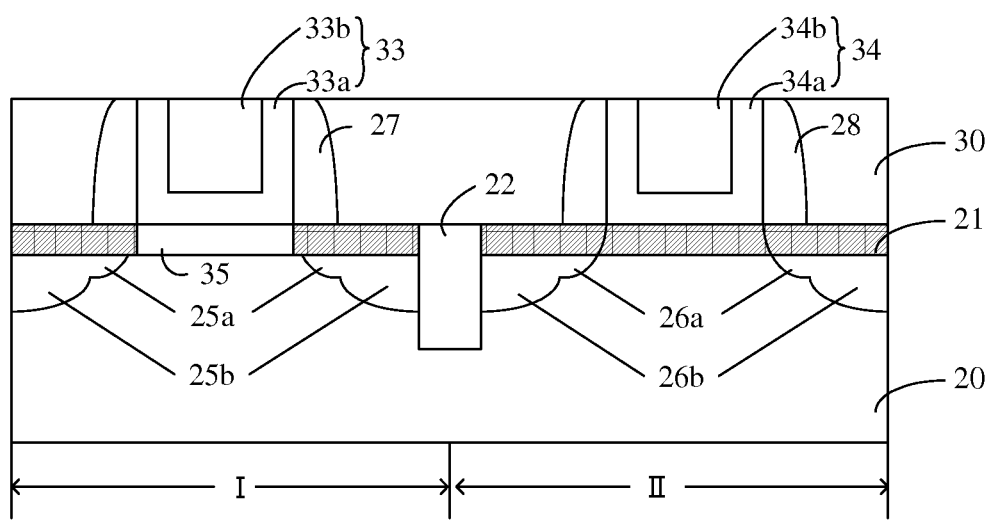

In addition, with reference to FIG. 16, in those embodiments where the second semiconductor layer at the bottom of the first opening is removed, before forming the first gate structure 33 and the second gate structure 34, a third semiconductor layer 35 may be formed at the bottom of the first opening, by e.g. epitaxy. Third semiconductor layer 35 has a surface aligned with that of the second semiconductor layer 21; has the same crystal face orientation as the first semiconductor layer 20, particularly in this embodiment, (100); and electrons have higher mobility than holes. Therefore, using the third semiconductor layer 35 as the channel region of the NMOS transistor can also improve carrier mobility in the NMOS transistor. Similarly, in other embodiments, if the second semiconductor layer at the bottom of the second opening is removed, before forming the first gate structure 33 and the second gate structure 34, a third semiconductor layer 35 may be formed at the bottom of the second opening. The third semiconductor layer 35 may have the same crystal face orientation as the first semiconductor layer 20, particularly in this embodiment, (110); and holes have higher mobility than electrons. Hence, using the third semiconductor layer 35 as the channel region of the PMOS transistor can also improve carrier mobility in the PMOS transistor. The surface of the third semiconductor layer 35 is aligned with the surface of the second semiconductor layer 21, which compensates for the height difference between the gate electrode 33b in the first gate structure 33 and the gate electrode 34b in the second gate structure 34, so that the gate electrode 33b and the gate electrode 34b have the same height, improving device uniformity and device performances.

Thus, the hybrid channel semiconductor device formed according to the embodiment is shown in FIG. 15, which may include: the first semiconductor layer 20 and the second semiconductor layer 21 covering the first semiconductor layer, wherein electrons have higher mobility than holes in one of the first semiconductor layer 20 and the second semiconductor layer 21, and holes have higher mobility than electrons in the other one of the first semiconductor layer 20 and the second semiconductor layer 21, and in this embodiment, the crystal face orientation of the first semiconductor layer 20 being (100) and the crystal face orientation of the second semiconductor layer 21 being (110); the first gate structure 33, formed on the first semiconductor layer 20 in the NMOS area I; the second gate structure 34, formed on the semiconductor layer 21 in the PMOS area II; the first source region and the first drain region, formed in the second semiconductor layer 21 and the first semiconductor layer 20 on the sides of the first gate structure 33 and being N-type doped; and the second source region and the second drain region, formed in the second semiconductor layer 21 and the first semiconductor layer 20 on the sides of the second gate structure 34 and being P-type doped. In addition, the hybrid channel semiconductor device in this embodiment may further include: the shallow trench isolation area 22, formed in the second semiconductor layer 21 and the first semiconductor layer 20 between the NMOS area I and the PMOS area II; the first sidewall 27, formed on the sides of the first gate structure 33; and the second sidewall 28, formed on the sides of the second gate structure 34. Particularly, the first source region and the first drain region may include the first lightly-doped area 25a in the second semiconductor layer 21 and the first semiconductor layer 20 underneath the first sidewall 27 and the first source/drain doped area 25b in the second semiconductor layer 21 and the first semiconductor layer 20 on the sides of the sidewall 27; and the second source region and the second drain region may include the second lightly-doped area 26a in the second semiconductor layer 21 and the first semiconductor layer 20 underneath the second sidewall 28 and the second source/drain doped area 26b in the second semiconductor layer 21 and the first semiconductor layer 20 on the sides of the second sidewall 28. Since the channel region of the NMOS transistor in the NMOS area I has a crystal face orientation of (100) and a high carrier (electron) mobility, and the channel region of the PMOS transistor in the PMOS area II has a crystal face orientation of (110) and also a high carrier (hole) mobility, the response of the hybrid channel semiconductor device according to the embodiment is fast. Moreover, ion implantation is used to form neither the first semiconductor layer 20 underneath the first gate structure 33 nor the formation of the second semiconductor layer 21 underneath the second gate structure, thereby defects in the channel regions of the device can be reduced.

In addition, with reference to FIG. 16, the hybrid channel semiconductor device in this embodiment may further include a third semiconductor layer 35 formed between the first semiconductor layer 20 and the first gate structure 33; the third semiconductor layer 35 has a surface aligned with that of the second semiconductor layer 21 and has the same crystal face orientation as the first semiconductor layer 20. Since the surface of the third semiconductor layer 35 is aligned with the surface of the second semiconductor layer 21, the gate electrode 33b and the gate electrode 33b may have the same height, and device uniformity can be improved.

It should be noted that the first sidewall 27, the second sidewall 28, the shallow trench isolation area 22, the first lightly doped area 25a, the second lightly doped area 26a and the third semiconductor layer 35 are all optional; in other embodiments, they may not be formed.

In this embodiment, the crystal face orientation of the first semiconductor layer 20 is (100) and the crystal face orientation of the second semiconductor layer 21 is (110). In other embodiments of the technical solution, alternations may be made as long as the channel region of the NMOS transistor has a crystal face orientation of (100) and the channel region of the PMOS transistor has a crystal face orientation of (110). For example, a first semiconductor layer having a crystal face orientation of (110) may be provided, with a second semiconductor layer having a crystal face orientation of (100) covering the first semiconductor layer. In this case, a part of the second semiconductor layer in the PMOS area II is removed according to the method in the above embodiment, so that the gate structure of the NMOS transistor is formed on the second semiconductor layer and the gate structure of the PMOS transistor is formed on the first semiconductor, thereby improving the performances of the whole hybrid channel semiconductor device.

To sum up, in the hybrid channel semiconductor device formed according to the technical solution, the crystal face orientation of the channel region of the NMOS transistor is (100) and the crystal face orientation of the channel region of the PMOS transistor is (110), so that carrier mobility is high in both the PMOS transistor and the NMOS transistor, defects in the channel regions can be reduced, and device performances can be improved.

The present invention is disclosed herein in connection with the preferred embodiments, which should not be interpreted as limiting the scope of the invention. Numerous alternations and modifications can be made by those skilled in the art to the technical solution of the present invention in light of the technical solution disclosed herein without deviation from the scope of the invention. Accordingly, any modifications, equivalents and alternations to the embodiments without deviation from the technical essence of the present invention shall fall within the scope of protection of the present invention.

The invention claimed is:

1. A method for forming a hybrid channel semiconductor device, comprising:
   providing a first semiconductor layer, the first semiconductor layer comprising an NMOS area and a PMOS area, a surface of the first semiconductor layer being covered by a second semiconductor layer, wherein electrons have higher mobility than holes in one of the first semiconductor layer and the second semiconductor layer, and holes have higher mobility than electrons in the other one of the first semiconductor layer and the second semiconductor layer;
   forming a first dummy gate structure on the second semiconductor layer in the NMOS area, forming a second dummy gate structure on the second semiconductor layer in the PMOS area, forming a first source region and a first drain region in the second semiconductor layer and the first semiconductor layer and on respective sides of the first dummy gate structure, forming a second source region and a second drain region in the second semiconductor layer and the first semiconductor layer on respective sides of the second dummy gate structure, the first source region and the first drain region being N-type doped, and the second source region and the second drain region being P-type doped;
   forming an interlayer dielectric layer on the second semiconductor layer and performing planarization on the interlayer dielectric layer, such that the interlayer dielectric layer covers the second semiconductor layer and has a surface aligned with those of the first dummy gate structure and the second dummy gate structure;
   removing the first dummy gate structure to form a first opening, removing the second dummy gate structure to form a second opening; and
   forming a first gate structure in the first opening and a second gate structure in the second opening, such that the first opening is filled up with the first gate structure and the second opening is filled up with the second gate structure, wherein the first gate structure is formed on the one of the first semiconductor layer and the second semiconductor layer in which electrons have higher mobility than holes, and the second gate structure is formed on the other one of the first semiconductor layer and the second semiconductor layer in which holes have higher mobility than electrons;
   wherein a crystal face orientation of the first semiconductor layer is (100) and a crystal face orientation of the second semiconductor layer is (110); and
   wherein forming a first gate structure in the first opening and a second gate structure in the second opening comprises:
      removing a portion of the second semiconductor layer at a bottom of the first opening such that the first semiconductor layer is exposed; and
      forming the first gate structure in the first opening and the second gate structure in the second opening.

2. The method for forming a hybrid channel semiconductor device according to claim 1, wherein, the second semiconductor layer has a thickness ranging from 3 nm to 10 nm.

3. The method for forming a hybrid channel semiconductor device according to claim 1, wherein, before forming the first gate structure and the second gate structure, the method further comprises: forming a third semiconductor layer at the bottom of the first opening, the third semiconductor layer having a surface aligned with that of the second semiconductor layer, and the third semiconductor layer having the same crystal face orientation as the first semiconductor layer.

4. The method for forming a hybrid channel semiconductor device according to claim 1, wherein the removing the portion of the second semiconductor layer at a bottom of the first opening comprises:
   forming a mask layer covering bottoms of the first opening and the second opening;
   patterning the mask layer to define a pattern of the first opening;
   performing etching to remove the portion of the second semiconductor layer at the bottom of the first opening by using the patterned mask layer as a mask; and
   removing the patterned mask layer.

5. The method for forming a hybrid channel semiconductor device according to claim 1, wherein the portion of the second semiconductor layer is removed by wet etching.

6. The method for forming a hybrid channel semiconductor device according to claim 5, wherein etchant used in the wet etching is a tetramethylammonium hydroxide solution.

7. The method for forming a hybrid channel semiconductor device according to claim 1, wherein, the first semiconductor layer and the second semiconductor layer are formed of the same material, the material being any one of: monocrystalline silicon, germanium, silicon-germanium, and a III-V compound.

8. The method for forming a hybrid channel semiconductor device according to claim 1, wherein the first semiconductor layer and the second semiconductor layer are formed of different materials, the material for the first semiconductor layer being one of: monocrystalline silicon, germanium, silicon-germanium, and a III-V compound; and the material for the second semiconductor layer being another one of: monocrystalline silicon, germanium, silicon-germanium, and a III-V compound.

* * * * *